US009018531B2

(12) United States Patent
Ding

(10) Patent No.: US 9,018,531 B2
(45) Date of Patent: Apr. 28, 2015

(54) MULTILAYER CIRCUIT BOARD AND MANUFACTURING METHOD THEREOF

(71) Applicant: Huawei Technologies Co., Ltd., Shenzhen, Guangdong (CN)

(72) Inventor: Li Ding, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 141 days.

(21) Appl. No.: 13/686,057

(22) Filed: Nov. 27, 2012

(65) Prior Publication Data

US 2013/0081859 A1 Apr. 4, 2013

Related U.S. Application Data

(63) Continuation of application No. PCT/CN2011/074807, filed on May 27, 2011.

(51) Int. Cl.
*H05K 1/02* (2006.01)
*H05K 3/46* (2006.01)

(52) U.S. Cl.
CPC ......... *H05K 1/0298* (2013.01); *Y10T 29/49126* (2015.01); *H05K 1/0266* (2013.01); *H05K 3/4611* (2013.01); *H05K 2201/09781* (2013.01); *H05K 2201/09936* (2013.01); *H05K 3/4638* (2013.01)

(58) Field of Classification Search
CPC . H05K 1/0298; H05K 3/4611; H05K 1/0266; H05K 3/4638; H05K 2201/09936; H05K 2201/09781
USPC ................... 174/250, 255, 257, 258; 361/748
See application file for complete search history.

(56) References Cited

U.S. PATENT DOCUMENTS 4,536,239 A * 8/1985 Benson ........................... 156/64
5,010,449 A 4/1991 Baldino et al.
(Continued)

FOREIGN PATENT DOCUMENTS

| CN | 2582331 Y | 10/2003 |
|---|---|---|
| CN | 2587131 Y | 11/2003 |

(Continued)

OTHER PUBLICATIONS

Foreign Communication From a Counterpart Application, International Application No. PCT/CN2011/074807, English Translation, International Search Report dated Mar. 15, 2012, 5 pages.

(Continued)

*Primary Examiner* — Hoa C Nguyen
*Assistant Examiner* — Amol Patel
(74) *Attorney, Agent, or Firm* — Conley Rose, P.C.; Grant Rodolph; Nicholas K. Beaulieu

(57) ABSTRACT

A multilayer circuit board is provided, which includes multiple core boards stacked together. The core board includes an insulation layer and at least one conductor layer attached together. The conductor layer includes a circuit. The core board has at least one identification conductor disposed at an edge of at least one conductor layer. The identification conductor forms an identification pattern on a side surface of the core board along a stacking direction of the core boards. The identification patterns of the multiple core boards are different from each other on the side surface of the multilayer circuit board along the stacking direction of the core boards. A manufacturing method of the multilayer circuit board is further provided.

20 Claims, 3 Drawing Sheets

(56) References Cited

U.S. PATENT DOCUMENTS

| | | | | |
|---|---|---|---|---|
| 5,266,380 A | * | 11/1993 | Renguso et al. | 428/192 |
| 6,091,026 A | * | 7/2000 | Yang | 174/255 |
| 2006/0157270 A1 | | 7/2006 | Ueno | |
| 2009/0087624 A1 | | 4/2009 | Sakai | |
| 2009/0211785 A1 | | 8/2009 | Lovskog | |

FOREIGN PATENT DOCUMENTS

| | | | |
|---|---|---|---|
| CN | 1942048 A | 4/2007 | |
| JP | 2004214472 A | 7/2004 | |

OTHER PUBLICATIONS

Foreign Communication From a Counterpart Application, Chinese Application 201180001632.4, Chinese Search Report dated Oct. 28, 2012, 2 pages.

Foreign Communication From a Counterpart Application, European Application No. 11768478.7, Extended European Search Report dated May 31, 2013, 5 pages.

* cited by examiner

MULTILAYER CIRCUIT BOARD AND MANUFACTURING METHOD THEREOF

CROSS-REFERENCE TO RELATED APPLICATIONS

This application is a continuation of International Application No. PCT/CN2011/074807, filed on May 27, 2011, which is hereby incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to the field of electronic communications technologies, and in particular, to a multilayer circuit board and a manufacturing method thereof.

BACKGROUND

In the manufacturing process of a multilayer circuit board, because the multilayer circuit board includes multiple layers of core boards stacked together, a stacking disorder may easily occur during the stacking of the core boards, especially when the number of core boards is great. For example, a core board A intended to be placed in a first layer is placed in a fifth layer.

In the implementation of the present invention, the inventor finds at least the following defect in the prior art. If the stacking order of two core boards is incorrect, the electric network connection is usually normal, but the impedance or S parameter of the wiring may be affected. Therefore, when a signal is transmitted, signal abnormity may occur and crosstalk increases.

SUMMARY

Embodiments of the present invention provide a multilayer circuit board and a manufacturing method thereof, so as to decrease a failure rate of core board stacking.

The embodiments of the present invention provide the following solutions:

The present invention provides an embodiment of a multilayer circuit board, including multiple core boards stacked together. The core board includes an insulation layer and at least one conductor layer attached together. The conductor layer includes a circuit. The core board has at least one identification conductor disposed at an edge of at least one conductor layer. The identification conductor forms an identification pattern on a side surface of the core board along a stacking direction of the core boards. The identification patterns of the multiple core boards are different from each other.

The present invention further provides a manufacturing method of a multilayer circuit board that includes: processing multiple core boards, which includes manufacturing at least one conductor layer on each of multiple insulation layers, where the conductor layer includes a circuit in the middle of the conductor layer and an identification conductor at an edge of the conductor layer, where identification conductors of the core boards form an identification pattern on a side surface of the core boards along a stacking direction of the core boards, and the identification patterns of the multiple core boards are different from each other; and identifying each core board among the multiple core boards according to the identification pattern of each core board among the multiple core boards, stacking each identified core board according to a stacking order, and laminating the core boards into a multilayer circuit board.

As seen from the foregoing technical solutions provided in the embodiments of the present invention, by disposing the identification conductor at the edge of the conductor layer, the identification conductors of the multiple core boards form different identification patterns on the side surfaces along the stacking direction of the core boards. In the manufacturing process of the multilayer circuit board, for example, in an inner layer processing stage, a stacking order may be arranged according to the identification patterns when the core boards are stacked. After the stacking is completed, it is also easy to check whether the stacking order of the core boards is correct according to the identification patterns and find and remove improperly stacked materials as early as possible. In this manner, semifinished products with incorrect core board stacking are prevented from entering the next procedure.

BRIEF DESCRIPTION OF THE DRAWINGS

To illustrate the technical solutions in the embodiments of the present invention more clearly, the following briefly describes the accompanying drawings required for describing the embodiments. Apparently, the accompanying drawings in the following description merely show some embodiments of the present invention, and persons of ordinary skill in the art can derive other drawings from the accompanying drawings without creative efforts.

DETAILED DESCRIPTION

To facilitate the understanding about the embodiments of the present invention, further description is made through several specific embodiments as examples with reference to the accompanying drawings, and each embodiment does not limit the embodiments of the present invention.

Figure 1:
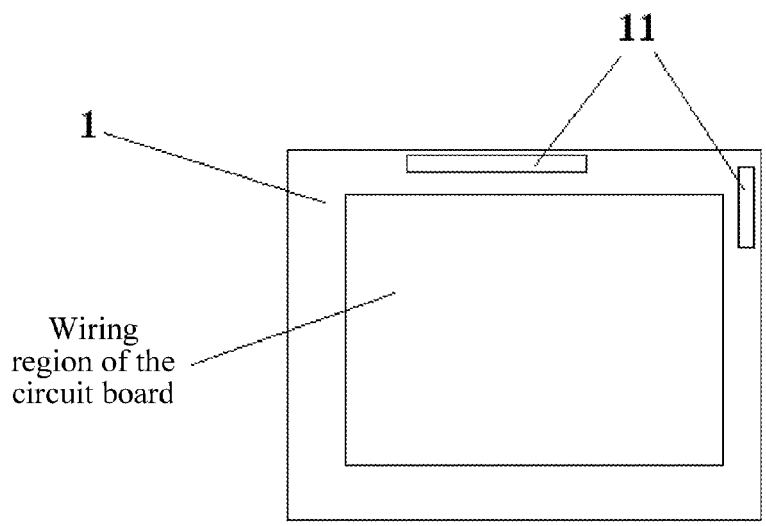
FIG. 1 is a schematic diagram of a core board in a multilayer circuit board according to the present invention.

As shown in FIG. 1, the present invention provides an embodiment of a multilayer circuit board, including multiple core boards 1 stacked together. The core board 1 includes an insulation layer and at least one conductor layer attached together. The conductor layer includes a circuit. The core board has at least one identification conductor 11 disposed at an edge of at least one conductor layer. The identification conductor 11 forms an identification pattern on a side surface of the core board along a stacking direction of the core boards. The identification patterns of the multiple core boards are different from each other on the side surface of the multilayer circuit board along the stacking direction of the core boards.

In the embodiment of the present invention, by disposing the identification conductor at the edge of the conductor layer, the identification conductors of the multiple core boards form different identification patterns on the side surfaces along the stacking direction of the core boards. In the manufacturing process of the multilayer circuit board, for example, in an inner layer processing stage, a stacking order may be arranged according to the identification patterns when the core boards are stacked. After the stacking is completed, it is also easy to check whether the stacking order of the core boards is correct according to the identification patterns and find and remove improperly stacked materials as early as possible. In this manner, semifinished products with incorrect core board stacking are prevented from entering the next procedure.

Furthermore, after the multilayer circuit board is manufactured, in a process of checking a finished product, whether the stacking order of the core boards is correct may be checked according to the identification patterns, so as to find and remove a unqualified multilayer circuit board as early as possible.

In addition, the structure of the adopted identification conductor is simple, and it merely needs to dispose the identification conductor at the edge of the conductor layer when the conductor layer is disposed for the core board. No extra procedure is added to the manufacturing process of the multilayer circuit board, and the processing is simple and convenient.

In the embodiment of the present invention, the core board may include an insulation layer and a conductor layer attached together, or the core board may include an insulation layer and two conductor layers attached together, where the insulation layer is located between the two conductor layers.

In the embodiment of the present invention, the identification pattern is a pattern presented by the identification conductor on the side surface of the core board along the stacking direction of the core boards.

In the embodiment of the present invention, at least one identification conductor may be disposed at an edge of a side of at least one conductor layer in the core board. In this manner, multiple identification patterns are formed on a side surface of the multilayer circuit board along the stacking direction of the core boards.

In the embodiment of the present invention, identification conductors may be disposed at edges of multiple sides of at least one conductor layer in the core board. In this manner, identification patterns are formed on multiple side surfaces of the multilayer circuit board along the stacking direction of the core boards. If identification conductors are disposed at edges of multiple sides of the conductor layer in the core board, the identification conductors form identification patterns on the multiple side surfaces of the core boards along the stacking direction of the core boards. The multiple identification patterns formed on the multiple side surfaces of the same core board along the stacking direction of the core boards may be different, so as to differentiate sides of the core board when the core boards are stacked.

In the embodiment of the present invention, the identification conductors disposed on the multiple core boards that form the multilayer circuit board may be located at different sides. In this manner, the identification patterns are disposed on the multiple side surfaces of the multilayer circuit board along the stacking direction of the core boards. The identification patterns of a part of the core boards are located on one side surface of the multilayer circuit board, and the identification patterns of the other part of the core boards are located on other side surfaces of the multilayer circuit board.

In the embodiment of the present invention, the length of an identification conductor may be determined according to a proportion of the board length of a core board to the board width of the core board, for example, the length of the identification conductor may be greater than or equal to 2 mm. If it is checked whether the stacking of the core boards is correct by eyes, the minimum requirement is that the length of the identification conductor is recognizable to eyes. If a test device is used for checking, the minimum requirement is that the identification conductor is recognizable to the test device.

The width of the identification conductor may range from 5 to 10 mil, or even smaller. The principle is that the width does not affect circuit layout in the middle of a conductor layer.

The identification conductor may be a copper sheet. The copper sheet may be a non-functional copper sheet. The non-functional copper sheet refers to a copper sheet on which no circuit is arranged.

The identification patterns of the multiple core boards are different from each other in the following aspects: the identification patterns on different core boards have different colors; the identification patterns on different core boards have different quantities; distances from the identification patterns on different core boards to the ends of sides where the identification patterns are located are different; or the identification patterns on different core boards are located on different side surfaces of the multilayer circuit board along the stacking direction of the core boards.

Figure 2:
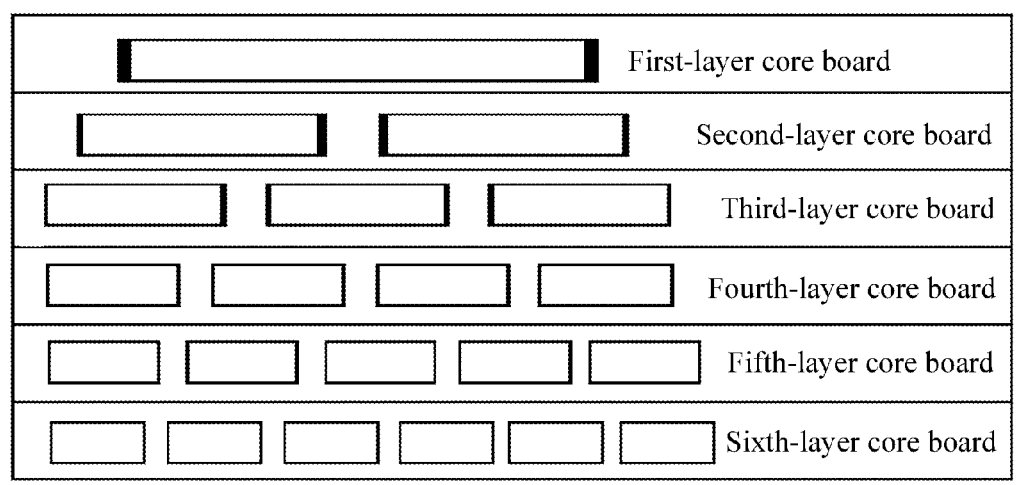
FIG. 2 is a schematic side diagram of a multilayer circuit board along a stacking direction of core boards according to the present invention.
Figure 3:
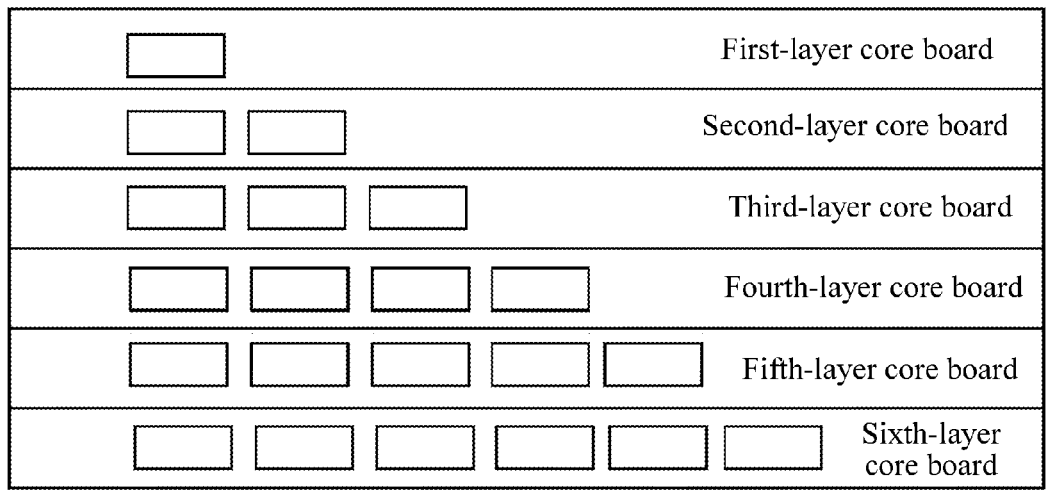
FIG. 3 is a schematic side diagram of another multilayer circuit board along a stacking direction of core boards according to the present invention.

That the identification patterns on different layers of the core boards have different quantities may be implemented in the following manner:

As shown in FIG. 2 or 3, the number of identification conductors of the core board is determined by which layer the core board is in the multilayer circuit board. For example, if a core board A is located on a fifth layer when counted from the top layer of the core board of the multilayer circuit board, five identification conductors may be arranged on the core board A. In this manner, after the core boards are stacked, it can be more clearly determined whether the stacking order of the core boards is correct according to the number of identification conductors on each layer of the core board. If an error is found, it can also be accurately determined which layer is improperly stacked. In FIG. 2, the sizes of the identification patterns on each layer of the core board are different, and in FIG. 3, the sizes of the identification patterns on each layer of the core board are roughly equal.

Figure 4:
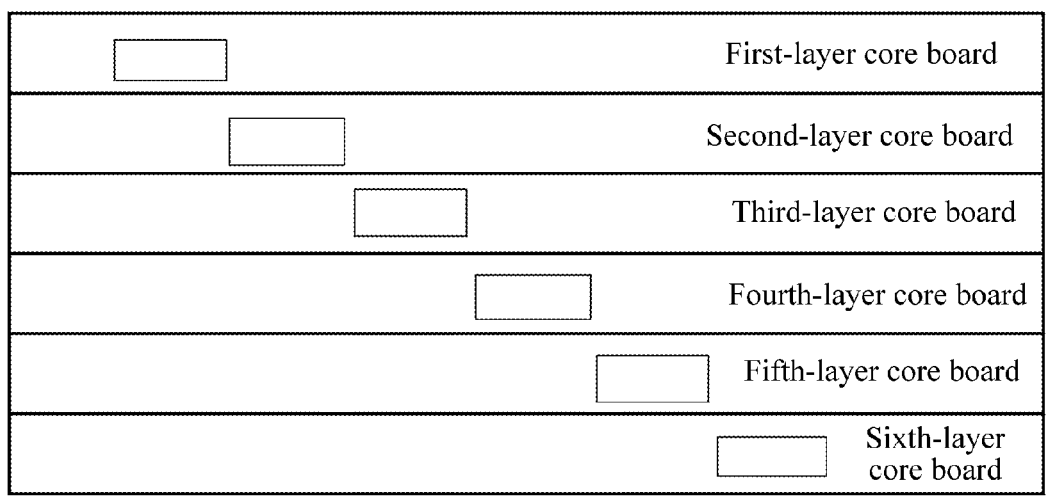
FIG. 4 is a schematic side diagram of still another multilayer circuit board along a stacking direction of core boards according to the present invention.

That the distances from the identification patterns on different layers of the core boards to the ends of the sides where the identification patterns are located are different may be implemented in the following manner:

As shown in FIG. 4, the identification patterns of the multiple core boards stacked together form an oblique line on the side surface of the multilayer circuit board; during the stacking of the core boards, it is easy to determine whether the stacking order of the core boards is correct.

In the embodiment of the present invention, the multilayer circuit board may be a backplane, a board, or the like.

Figure 5:
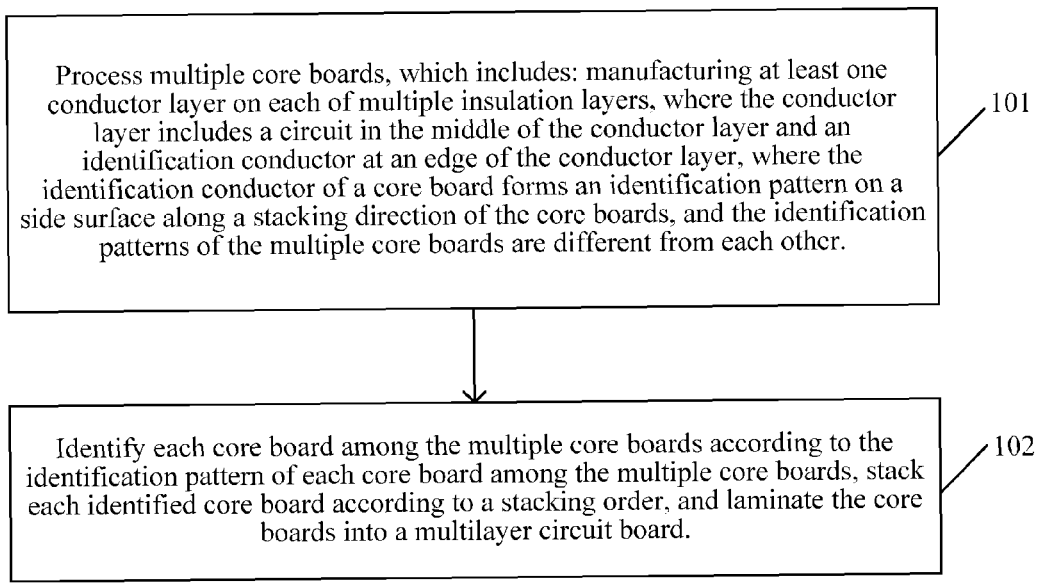
FIG. 5 is a schematic flowchart of a manufacturing method of a multilayer circuit board according to the present invention.

As shown FIG. 5, the present invention further provides an embodiment of a manufacturing method of a multilayer circuit board that includes:

Step 101: Process multiple core boards, which includes: manufacturing at least one conductor layer on each of multiple insulation layers, where the conductor layer includes a circuit in the middle of the conductor layer and an identification conductor at an edge of the conductor layer, where the identification conductor of a core board forms an identification pattern on a side surface of the core board along a stacking direction of the core boards, and the identification patterns of the multiple core boards are different from each other.

Step 102: Identify each core board among the multiple core boards according to the identification pattern of each core board among the multiple core boards, stack each identified core board according to a stacking order, and laminate the core boards into a multilayer circuit board.

In the embodiment of the present invention, by disposing the identification conductor at the edge of the conductor layer, the identification conductors of the multiple core boards form different identification patterns on the side surfaces along the stacking direction of the core boards. In the manufacturing process of the multilayer circuit board, for example, in an inner layer processing stage, a stacking order may be arranged according to the identification patterns when the core boards are stacked. After the stacking is completed, it is also easy to check whether the stacking order of the core boards is correct according to the identification patterns and find and remove improperly stacked materials as early as possible. In this manner, semifinished products with incorrect core board stacking are prevented from entering the next procedure.

Furthermore, after the multilayer circuit board is manufactured, in a process of checking a finished product, whether the stacking order of the core boards is correct may be checked according to the identification patterns, so as to find and remove an unqualified multilayer circuit board as early as possible.

In addition, the structure of the adopted identification conductor is simple, and it merely needs to dispose the identification conductor at the edge of the conductor layer when the conductor layer is disposed for the core board. No extra procedure is added to the manufacturing process of the multilayer circuit board, and the processing is simple and convenient.

In the embodiment of the present invention, the stacking order may be a stacking order of the multiple core boards which is predetermined according to the function of each core board and a circuit connection relationship.

In the embodiment of the present invention, the length of an identification conductor may be determined according to a proportion of the board length of a core board to the board width of the core board, for example, the length of the identification conductor may be greater than or equal to 2 mm. If it is checked whether the stacking of the core boards is correct by eyes, the minimum requirement is that the length of the identification conductor is recognizable to eyes. If a test device is used for checking, the minimum requirement is that the identification conductor is recognizable to the test device.

The width of the identification conductor may range from 5 to 10 mil, or even smaller. The principle is that the width does not affect circuit layout in the middle of a conductor layer.

The identification conductor may be a copper sheet. The copper sheet may be a non-functional copper sheet. The non-functional copper sheet refers to a copper sheet on which no circuit is arranged.

The identification patterns of the multiple core boards are different from each other in the following aspects: the identification patterns on different core boards have different colors; the identification patterns on different core boards have different quantities; the distances from the identification patterns on different core boards to the ends of the sides where the identification patterns are located are different; or the identification patterns on different core boards are located on different side surfaces of the multilayer circuit board along the stacking direction of the core boards.

The foregoing description is merely about exemplary embodiments of the present invention, but not intended to limit the protection scope of the present invention. Any variation or replacement readily made by persons skilled in the art within the technical scope disclosed by the present invention shall fall within the protection scope of the present invention. Therefore, the protection scope of the present invention shall be subject to the claims.

What is claimed is:

1. A multilayer circuit board comprising:
multiple core boards stacked together,
wherein each of the core boards comprises an insulation layer and at least one conductor layer attached together,
wherein each conductor layer comprises a circuit,
wherein each core board has a number of identification conductors disposed at an edge of the at least one conductor layer,
wherein the number of identification conductors for each core board is different from each other such that each core board has a different number of identification conductors,
wherein the number of identification conductors for each core board forms an identification pattern on a side surface of the core board along a stacking direction of the core boards,
wherein the identification patterns of the multiple core boards are different from each other on side surfaces of the multilayer circuit board along the stacking direction of the core boards,
wherein the multiple core boards comprise a first core board, a last core board, and multiple intermediary core boards between the first core board and the last core board along the stacking direction of the core boards, and
wherein the number of identification conductors for each core board increases along the stacking direction of the core boards such that the first core board has a fewest number of identification conductors, the last core board has a greatest number of identification conductors, and the multiple intermediary core boards have numbers of identification conductors that are between the fewest number of identification conductors and the greatest number of identification conductors.

2. The multilayer circuit board according to claim 1, wherein all of the identification conductors have a rectangular shape, and wherein sizes of the identification conductors for each core board decrease along the stacking direction of the core boards such that the first core board has a largest identification conductor, the last core board has a smallest identification conductor, and the multiple intermediary core boards have sizes of the identification conductors that are between the smallest identification conductor and the largest identification conductor.

3. The multilayer circuit board according to claim 1, wherein a length of each identification conductor is greater than or equal to 2 millimeters (mm), and wherein a width of each identification conductor ranges from 5 to 10 thousandths of an inch (mil).

4. The multilayer circuit board according to claim 1, wherein each identification conductor is a non-functional copper sheet.

5. The multilayer circuit board according to claim 1, wherein the identification patterns on different core boards have different colors.

6. The multilayer circuit board according to claim 1, wherein distances from the identification patterns on different core boards to the ends of sides where the identification patterns are located are different.

7. The multilayer circuit board according to claim 1, wherein the identification patterns on different core boards are located on different side surfaces of the multilayer circuit board along the stacking direction of the core boards.

8. The multilayer circuit board according to claim 1, wherein each of the identification conductors on each core board has a rectangular shape and has an approximately same width and length.

9. The multilayer circuit board according to claim 1, wherein all of the identification conductors have a rectangular shape, wherein each identification conductor within one of the core boards has an approximately same width and length, and wherein the identification conductors from different core boards have different widths and lengths.

10. A manufacturing method of a multilayer circuit board comprising:
processing multiple core boards by manufacturing at least one conductor layer on each of multiple insulation layers, wherein the conductor layer comprises a circuit in the middle of the conductor layer and a number of identification conductors at an edge of the conductor layer, wherein the number of identification conductors for each core board is different from each other such that each core board has a different number of identification conductors, wherein the number of identification conductors for each core board forms an identification pattern on a side surface of the core board along a stacking direction of the core boards, wherein the identification patterns of the multiple core boards are different from each other, wherein the multiple core boards comprise a first core board, a last core board, and multiple intermediary core boards between the first core board and the last core board along the stacking direction of the core boards, and wherein the number of identification conductors for each core board increases along the stacking direction of the core boards such that the first core board has a fewest number of identification conductors, the last core board has a greatest number of identification conductors, and the multiple intermediary core boards have numbers of identification conductors that are between the fewest number of identification conductors and the greatest number of identification conductors;
identifying each core board among the multiple core boards according to the identification pattern of each core board among the multiple core boards;
stacking each identified core board according to a stacking order; and
laminating the core boards into a multilayer circuit board.

11. The manufacturing method of a multilayer circuit board according to claim 10, wherein all of the identification conductors have a rectangular shape, and wherein sizes of the identification conductors for each core board decrease along the stacking direction of the core boards such that the first core board has a largest identification conductor, the last core board has a smallest identification conductor, and the multiple intermediary core boards have sizes of the identification conductors that are between the smallest identification conductor and the largest identification conductor.

12. The manufacturing method of a multilayer circuit board according to claim 10, wherein a length of each identification conductor is greater than or equal to 2 millimeters (mm), and wherein a width of each identification conductor ranges from 5 to 10 thousandths of an inch (mil).

13. The manufacturing method of a multilayer circuit board according to claim 10, wherein each identification conductor is a non-functional copper sheet.

14. The manufacturing method of a multilayer circuit board according to claim 10, wherein the identification patterns on different core boards have different colors.

15. The manufacturing method of a multilayer circuit board according to claim 10, wherein distances from the identification patterns on different core boards to the ends of sides where the identification patterns are located are different.

16. The manufacturing method of a multilayer circuit board according to claim 10, wherein the identification patterns on different core boards are located on different side surfaces of the multilayer circuit board along the stacking direction of the core boards.

17. The manufacturing method of a multilayer circuit board according to claim 10, wherein each of the identification conductors on each core board has a rectangular shape and has an approximately same width and length.

18. The manufacturing method of a multilayer circuit board according to claim 10, wherein all of the identification conductors have a rectangular shape, wherein each identification conductor within one of the core boards has an approximately same width and length, and wherein the identification conductors from different core boards have different widths and lengths.

19. A multilayer circuit board comprising:
multiple core boards stacked together,
wherein each of the core boards comprises an insulation layer and at least one conductor layer attached together,
wherein each conductor layer comprises a circuit,
wherein each core board has a number of identification conductors disposed at an edge of the at least one conductor layer,
wherein the number of identification conductors for each core board is different from each other such that each core board has a different number of identification conductors,
wherein each identification conductor within one of the core boards has an approximately same width and length,
wherein the identification conductors from different core boards have different widths and lengths,
wherein the number of identification conductors for each core board forms an identification pattern on a side surface of the core board along a stacking direction of the core boards,
wherein the identification patterns of the multiple core boards are different from each other on side surfaces of the multilayer circuit board along the stacking direction of the core boards,
wherein the multiple core boards comprise a first core board, a last core board, and multiple intermediary core boards between the first core board and the last core board along the stacking direction of the core boards, and
wherein the number of identification conductors for each core board increases along the stacking direction of the core boards such that the first core board has a fewest number of identification conductors, the last core board has a greatest number of identification conductors, and the multiple intermediary core boards have numbers of identification conductors that are between the fewest number of identification conductors and the greatest number of identification conductors.

20. The multilayer circuit board according to claim 19, wherein the identification patterns on different core boards have different colors, wherein all of the identification conductors have a rectangular shape, and wherein sizes of the identification conductors for each core board decrease along the stacking direction of the core boards such that the first core board has a largest identification conductor, the last core board has a smallest identification conductor, and the multiple intermediary core boards have sizes of the identification conductors that are between the smallest identification conductor and the largest identification conductor.

* * * * *